(12) United States Patent
Lin

(10) Patent No.: US 6,303,252 B1
(45) Date of Patent: Oct. 16, 2001

(54) RETICLE HAVING ASSIST FEATURE BETWEEN SEMI-DENSE LINES

(75) Inventor: Chin-Lung Lin, Kaohsiung (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/470,635

(22) Filed: Dec. 27, 1999

(51) Int. Cl.[7] .................................................. G03F 9/00
(52) U.S. Cl. ............................................................ 430/5
(58) Field of Search ............................. 430/5, 296, 311, 430/22

(56) References Cited

U.S. PATENT DOCUMENTS 5,667,918 * 9/1997 Brainerd et al. ........................ 430/5
6,165,693 * 12/2000 Lin et al. ................................. 430/5

* cited by examiner

Primary Examiner—S. Rosasco

(57) ABSTRACT

A reticle having an assist feature between semi-dense lines is described. The reticle has two adjacent, substantially parallel, and substantially equally spaced line segments of which each representing a portion of a main feature having a line width, between two adjacent line segments of the group having a gap space, wherein the gap-space/line-width ratio is equal to about 3–6.5. Between the two adjacent line segments, at least one inside assist feature is located. At the outside edges of the extreme left-hand and right-hand line segments, two outside assist features are located, respectively, wherein each of the two assist features has a first width and is spaced apart from the nearest line segment by a distance.

16 Claims, 2 Drawing Sheets

RETICLE HAVING ASSIST FEATURE BETWEEN SEMI-DENSE LINES

BACKGROUND OF THE INVENTION

1. Technical Field

The present invention relates to lithography, and particularly to a reticle for use in a lithography system.

2. Description of Related Art

Three main types of exposure techniques used for transferring patterns from the reticle to the photoresist include: contact type, proximity type and projection type. For the semiconductor technique of deep sub-micron, the precision of the exposure technique is highly limited to photo-resolution. This limitation may cause error or even failure to the pattern transferring. Taking proximity exposure technique as an example, the original pattern of the reticle lines are often different from the transferred pattern of the lines on the photoresist after the exposure step.

If the lines of the reticle are isolated, i.e., the gap spaces between the adjacent isolated lines are large such that the space/line ratio is higher than about 6.5, skilled persons locate assist features at the outside of every isolated line to gain sufficient process window thereof. A sufficient process window ensures that the pattern of the transferred lines are substantially the same as the pattern of the reticle lines. If the reticle lines of the reticle are dense, i.e., the gap spaces between the adjacent dense lines are small such that the space/line ratio is lower than about 3.0, skilled persons locate assist features at the outside edges of the extreme outer lines, but locate no assist feature between the dense lines. This is because locating an assist feature between dense lines easily induces sidelobe problems or increases mask-error factors.

However, in the semi-dense region of the reticle, i.e., the region where the space/line ratio is equal to about 3.0–6.5, skilled persons encounter a catch-22 situation. That is, inserting no assist feature between the semi-dense lines gains insufficient process window, however, on the other hand, inserting an assist feature easily induces sidelobe problems or increase mask-error factors.

SUMMARY OF THE INVENTION

It is an object of this invention to provide a reticle having an assist feature between the adjacent lines of the reticle.

Other objects and advantages of this invention will become apparent to those of ordinary skill in the art having reference to the following specification in conjunction the drawings.

The present invention is directed to a reticle having two adjacent, substantially parallel, and substantially equally spaced line segments of which each representing a portion of a main feature having a line width. Between two adjacent line segments of the group there exists a gap space. The reticle comprises at least one inside assist feature located between the two adjacent line segments, if the gap-space/line-width ratio is equal to about 3–6.5. The reticle further comprises two outside assist features located at the outside edges of the extreme left-hand and right-hand line segments, respectively, wherein each of the two assist features has a first width and is spaced apart from the nearest line segment by a distance.

The inside assist feature has a preferable second width substantially narrower than the first width if the gap-space/line-width ratio is equal to about 3–4. More preferably, the second width is equal to the first width multiplied a number of about 0.7–0.8. Most preferably, the second width is equal to the first width multiplied a number of about 0.75.

If the gap-space/line-width ratio is about 5.4–6.5,5, there are two inside assist features located between the two adjacent line segments, wherein each of the two inside assist features is spaced apart from the nearest line segment. Each of the two inside assist features has a preferable third width substantially narrower than the first width. More preferably, the third width is equal to the first width multiplied a number of about 0.7–0.8. Most preferably, the third width is equal to the first width multiplied a number of about 0.75.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENTS

In the following Examples, various specific embodiments of the mask according to the invention will be described.

EXAMPLE 1

Figure 1:
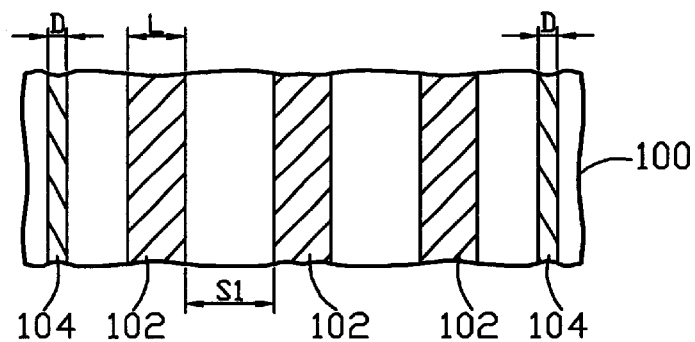
FIG. 1 is a schematic, top view showing a portion of a patterned optical lithographic mask (reticle)

A patterned optical lithographic mask (reticle) has a portion 100 indicated in FIG. 1. The portion 100 comprises a group of parallel and substantially equally spaced line segments 102, each representing a portion of a main feature having a width L. Between adjacent line segments 102 there exist substantially equal gap spaces $S_1$, such that $S_1/L<3$. The gaps between the line segments 102 are all substantially transparent.

Two assist features 104 are located at the outside edges of the extreme left-hand and right-hand line segments 102, respectively. Each of the assist features 104 has a width D and is spaced apart from the nearest line segment by a distance.

EXAMPLE 2

Figure 2:
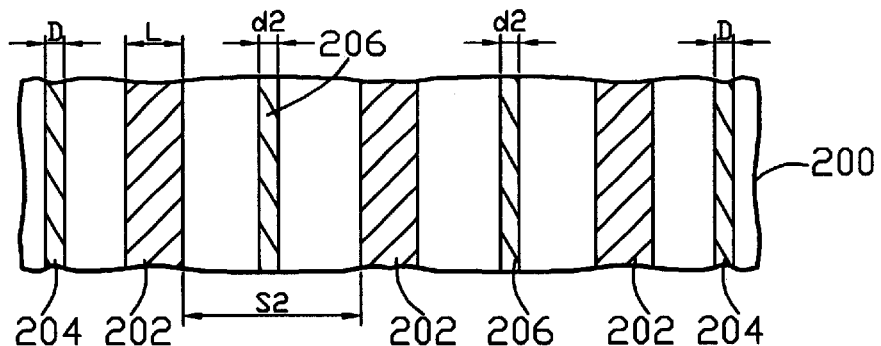
FIG. 2 is a schematic, top view of another embodiment showing a portion of a reticle.

A patterned optical lithographic mask (reticle) has a portion 200 indicated in FIG. 2. The portion 200 comprises a group of parallel line segments 202 each having a width L, and further comprises two assist features 204 located at the outside edges of the extreme left-hand and right-hand line segments 202, respectively. Each of the assist features 204 has a width D and is spaced apart from the nearest line segment by a distance.

In this Example 2, the situation with respect to the line segments 202 is substantially the same as that described under Example 1 excepts the substantially equal gap spaces $S_2$ between adjacent line segments 202, such that $S_2>S_1$ and $S_2/L=3-4$.

Besides the outside assist features 204, additional two assist features 206 are inserted centrally between the line segments 202, respectively. Each of the inside assist features 206 has a preferable width $d_2$ substantially narrower than the width D of each of the outside assist features 204, because inserting assist features having a width D in case of $S_2/L=$ 3–4 will result in sidelobe problems or increase other mask-error factors. The width $d_2$ is more preferably equal to about 0.7–0.8D, and most preferably about 0.75D.

EXAMPLE 3

Figure 3:
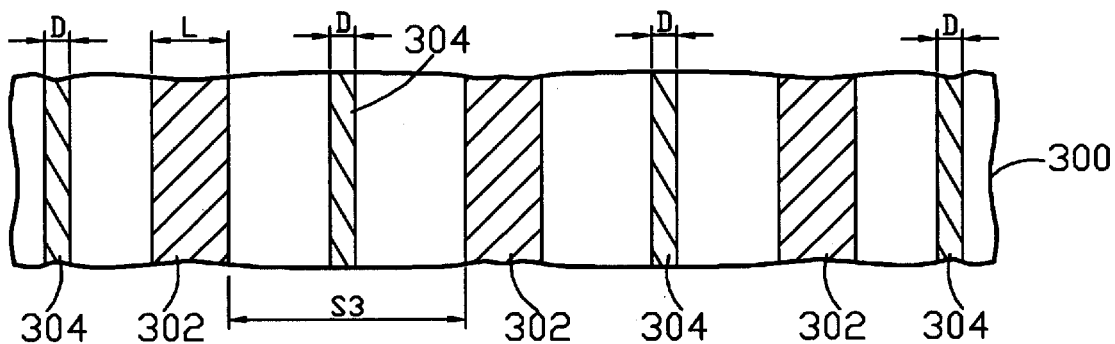
FIG. 3 is a schematic, top view of still another embodiment showing a portion of a reticle.

Referring to FIG. 3, which indicates a portion of a patterned optical lithographic mask (reticle) 300. In this Example 3, the situation with respect to the line segments 302 (but not the assist features 304) is substantially the same as that described under Example 2 except that in this Example 3 the ratio $S_3/L$ is equal to about 4–5.4. Each of the assist features 304 inserted between the line segments 302 has a width D substantially equal to that of each of the outside assist features described under Example 2 and Example 1.

EXAMPLE 4

Figure 4:
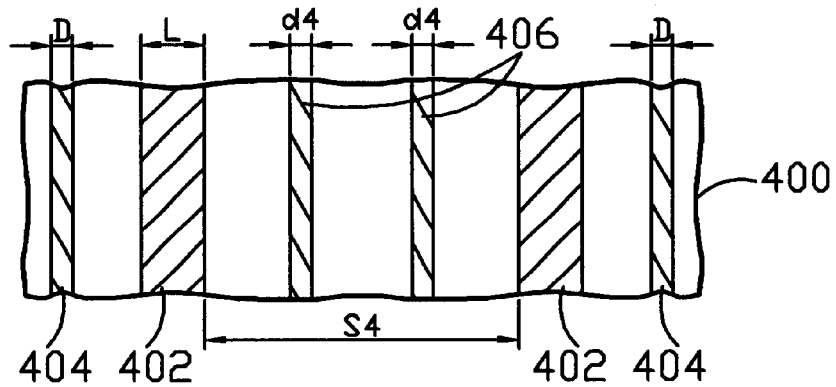
FIG. 4 is a schematic, top view of further embodiment showing a portion of a reticle.

A patterned optical lithographic mask (reticle) has a portion 400 indicated in FIG. 4. The portion 400 comprises a group of parallel line segments 402, each representing a portion of a main feature having a width L. Between adjacent line segments 402 there exist substantially equal gap spaces $S_4$, such that $S_4/L=5.4–6.5$. The gaps between the line segments are all substantially transparent.

Two assist features 404 are located at the outside edges of the extreme left-hand and right-hand line segments, respectively. Each of the assist features 404 has a width D and is spaced apart from the nearest line segment by a distance.

Besides the outside assist features, additional two assist features 406 are inserted between the adjacent line segments 404. Each of the additional assist features 406 has a width $d_4$ substantially narrower than the width D of each of the outside assist features, because inserting two assist features having a width D in case of $S_4/L=5.4–6.5$ will result in sidelobe problems or increase other mask-error factors. On the other hand, inserting only single assist feature having a width D between the two adjacent line segments gains insufficient process window of the line segments 404. Accordingly, between the adjacent line segments 404, we insert two assist features 406 where each has a width $d_4$ preferably equal to about 0.7–0.8D, and more preferably about 0.75D.

EXAMPLE 5

Figure 5:
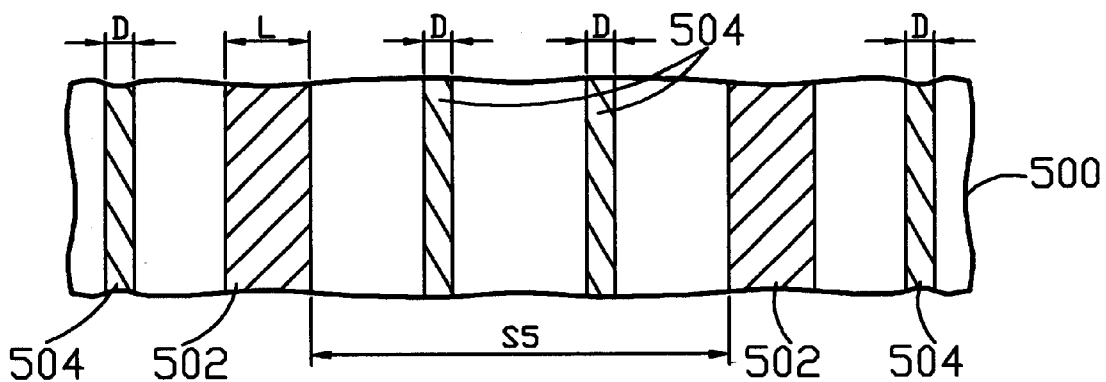
FIG. 5 is a schematic, top view of still further embodiment showing a portion of a reticle.

Referring to FIG. 5, which indicates a portion of a patterned optical lithographic mask (reticle) 500. In this Example 5, the situation with respect to the line segments 502 (but not the assist features 504) is substantially the same as that described under Example 4 except the ratio $S_5/L>6.5$. Each of the assist features 504 inserted between the line segments 502 has a width D substantially equal to that of each of the outside assist features described under Examples 1–4, and is spaced apart from the nearest line segment by a distance.

The previously described embodiments of the present invention have many advantages. For example, if the gap-space/line-width ratio is equal to about 3–4 or about 5.4–6.5, inserting inside assist feature(s) substantially narrower than the outside assist features can gain sufficient process window without causing sidelobe problems or increasing mask-error factors.

Although specific embodiments have been illustrated and described, it will be obvious to those skilled in the art that various modifications may be made without departing from the spirit which is intended to be limited solely by the appended claims.

What is claimed is:

1. A reticle having two adjacent, substantially parallel, and substantially equally spaced line segments of which each representing a portion of a main feature having a line width, between two adjacent line segments of the group having a gap space, the reticle comprises:

two outside assist features respectively located at the outside edges of the extreme left-hand and right-hand line segments, wherein each of the two assist features has a first width and is spaced apart from the nearest line segment by a distance; and at least one inside assist feature located between the two adjacent line segments, if the gap-space/line-width ratio is equal to about 3–6.5.

2. The reticle of claim 1, wherein the inside assist feature has a second width substantially narrower than the first width if the gap-space/line-width ratio is equal to about 3–4.

3. The reticle of claim 2, wherein the second width is equal to the first width multiplied a number of about 0.7–0.8.

4. The reticle of claim 3, wherein the second width is equal to the first width multiplied a number of about 0.75.

5. The reticle of claim 1, wherein two inside assist features are located between the two adjacent line segments if the gap-space/line-width ratio is about 5.4–6.5, and wherein each of the two inside assist features is spaced apart from the nearest line segment.

6. The reticle of claim 5, wherein each of the two inside assist features has a third width substantially narrower than the first width.

7. The reticle of claim 6, wherein the third width is equal to the first width multiplied a number of about 0.7–0.8.

8. The reticle of claim 7, wherein the third width is equal to the first width multiplied a number of about 0.75.

9. A reticle comprises a group of parallel and substantially equally spaced line segments of which each representing a portion of a main feature having a line width, between two adjacent line segments of the group having a gap space, wherein the gap-space/line-width ratio is substantially over 3, which reticle further comprises:

at least one inside assist feature located between the two adjacent line segments; and two outside assist features respectively located at the outside edges of the extreme left-hand and right-hand line segments, wherein each of the two assist features has a first width and is spaced apart from the nearest line segment by a distance.

10. The reticle of claim 9, wherein the inside assist feature has a second width substantially narrower than the first width if the gap-space/line-width ratio is equal to about 3–4.

11. The reticle of claim 10, wherein the second width is equal to the first width multiplied a number of about 0.7–0.8.

12. The reticle of claim 11, wherein the second width is equal to the first width multiplied a number of about 0.75.

13. The reticle of claim 9, wherein two inside assist features are located between the two adjacent line segments if the gap-space/line-width ratio is about 5.4–6.5, and wherein each of the two inside assist features is spaced apart from the nearest line segment.

14. The reticle of claim 13, wherein each of the two inside assist features has a third width substantially narrower than the first width.

15. The reticle of claim 14, wherein the third width is equal to the first width multiplied a number of about 0.7–0.8.

16. The reticle of claim 15, wherein the third width is equal to the first width multiplied a number of about 0.75.

* * * * *